United States Patent
Park et al.

(10) Patent No.: US 9,083,279 B2
(45) Date of Patent: Jul. 14, 2015

(54) OSCILLATOR USING SPIN TRANSFER TORQUE

(71) Applicant: KOREA INSTITUTE OF SCIENCE AND TECHNOLOGY, Seoul (KR)

(72) Inventors: Jae Hyun Park, Seoul (KR); Byoung Chul Min, Seoul (KR); Kyung Ho Shin, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 86 days.

(21) Appl. No.: 13/898,629

(22) Filed: May 21, 2013

(65) Prior Publication Data
US 2013/0314166 A1  Nov. 28, 2013

(30) Foreign Application Priority Data
May 24, 2012 (KR) .................. 10-2012-0055554

(51) Int. Cl.
*H03B 15/00* (2006.01)

(52) U.S. Cl.
CPC ................ *H03B 15/006* (2013.01)

(58) Field of Classification Search
CPC .............................. H03B 15/00; H03B 15/006
USPC ..................... 331/94.1; 365/171; 360/324.2
See application file for complete search history.

(56) References Cited

U.S. PATENT DOCUMENTS

| | | | |
|---|---|---|---|
| 5,764,567 A | 6/1998 | Parkin | |
| 5,841,692 A | 11/1998 | Gallagher et al. | |
| 6,452,764 B1 | 9/2002 | Abraham et al. | |
| 6,590,750 B2 | 7/2003 | Abraham et al. | |
| 2005/0063222 A1* | 3/2005 | Huai et al. | 365/171 |
| 2007/0064350 A1* | 3/2007 | Gill | 360/324.2 |
| 2008/0182133 A1* | 7/2008 | Shiimoto et al. | 428/811.2 |
| 2010/0178714 A1* | 7/2010 | Cho et al. | 438/3 |

FOREIGN PATENT DOCUMENTS

| | | |
|---|---|---|
| JP | 2002-150511 A | 5/2002 |
| KR | 1019990036653 A | 5/1999 |
| KR | 100280558 B1 | 11/2000 |
| KR | 1020010007359 A | 1/2001 |
| KR | 1020050025125 A | 3/2005 |
| KR | 1020050084288 A | 8/2005 |
| KR | 10200850070812 A | 7/2008 |
| KR | 10-1018502 B1 | 2/2011 |
| KR | 10-1039384 B1 | 5/2011 |

* cited by examiner

*Primary Examiner* — Joseph Chang
*Assistant Examiner* — Jeffrey Shin
(74) *Attorney, Agent, or Firm* — Ladas & Parry LLP (57) ABSTRACT

An oscillator using spin transfer torque includes i) a pinned magnetic layer having a fixed magnetization direction, ii) a non-magnetic layer located on the pinned magnetic layer, and iii) a free magnetic layer located on the non-magnetic layer. The pinned magnetic layer includes i) a first part of the fixed magnetic layer and ii) a second part of the fixed magnetic layer located thereon. The first part of the fixed magnetic layer includes i) a first interface in contact with the second part of the fixed magnetic layer and ii) a second surface exposed to an outside while surrounding the first interface.

20 Claims, 7 Drawing Sheets

OSCILLATOR USING SPIN TRANSFER TORQUE

CROSS-REFERENCE TO RELATED APPLICATION

This application claims priority to and the benefit of Korean Patent Application No. 10-2012-0055554 filed in the Korean Intellectual Property Office on May 24, 2012, the entire contents of which are incorporated herein by reference.

BACKGROUND OF THE INVENTION (a) Field of the Invention

The present invention relates to an oscillator using spin transfer torque. More particularly, the present invention relates to an oscillator using spin transfer torque in a magnetic tunnel junction.

(b) Description of the Related Art

Controlling the magnetization of a magnetic layer by Spin Transfer Torque (STT) has been recently studied in order to implement a high density electronic circuit. According to the aforementioned method, conduction electrons spin-polarized by a pinned magnetic layer pass through a non-magnetic layer and then spin angular momentum of the conduction electrons is transferred to a free magnetic layer. As a consequence, the magnetization of free layer, for example, in a magnetoresistive device such as a magnetic tunnel junction (MTJ) is controlled. When the STT transferred by the conduction electrons is balanced with inherent damping torque of the free magnetic layer, which is in the opposite direction, the magnetization of the free magnetic layer can have a steady precession. If the magneto-resistance characteristic of the device is combined with the precession, a high frequency oscillation signal can be obtained. The frequency of the oscillation signal ranges from several GHz to several tens of GHz.

As described above, a typical oscillator using the STT includes a pinned magnetic layer, a non-magnetic layer, and a free magnetic layer. When a current larger than a threshold value and an external magnetic field are simultaneously applied to the oscillator, the oscillator generates a high frequency alternating current signal. The magnetization of the free magnetic layer rotates with a frequency of several GHz to several tens of GHz.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an oscillator having advantages of capable of obtaining a high frequency oscillation characteristic even when an external magnetic field is not applied to the oscillator.

An exemplary embodiment of the present invention provides an oscillator including i) a pinned magnetic layer having a fixed magnetization, ii) a non-magnetic layer located on the pinned magnetic layer, and iii) a free magnetic layer located on the non-magnetic layer and having a switchable magnetization and rotating with respect to the direction of the pinned magnetic layer. The pinned magnetic layer may have a magnetization direction parallel to the interface. The pinned magnetic layer may include i) a part of the fixed magnetic layer and ii) a part of the fixed magnetic layer located on the first part of the fixed magnetic layer and that comes in contact with the non-magnetic layer.

The first part of the fixed magnetic layer may include i) an interface in contact with the second part of the fixed magnetic layer and ii) an exposed surface surrounding the interface.

The height of the second part of the fixed magnetic layer may be larger than the height of the first part of the fixed magnetic layer. The exposed surface surrounding the interface may have a ring shape. The pinned magnetic layer and the free magnetic layer may include a compound having a chemical formula, $(A_{100-x}B_x)_{100-y}C_y$ ($0<x<100$, $0<y<100$), and "A" and "B" may be metal elements and "C" may be an element to obtain an amorphous state.

A cross-sectional area of the second part of the fixed magnetic layer cut along the direction parallel to the first interface can be almost equal to the area of the interface in which the second part of the fixed magnetic layer is in contact with the non-magnetic layer. The exposed surface surrounding the interface may be formed by etching the pinned magnetic layer.

Another exemplary embodiment of the present invention provides an oscillator including i) a pinned magnetic layer having a fixed magnetization, ii) a non-magnetic layer located on the pinned magnetic layer, and iii) a free magnetic layer located on the non-magnetic layer and having a switchable magnetization and rotating with respect to the direction of the pinned magnetic layer. The pinned magnetic layer may have a magnetization parallel to the interface, and may include i) an antiferromagnetic layer, ii) a first ferromagnetic layer located on the antiferromagnetic layer, iii) a non-magnetic metal layer located on the first ferromagnetic layer, and iv) a second ferromagnetic layer located on the non-magnetic metal layer and that comes in contact with the non-magnetic layer. The second ferromagnetic layer may include i) a lower part of the second ferromagnetic layer and ii) a upper part of the second ferromagnetic layer located on the lower part of the second ferromagnetic layer and that comes in contact with the non-magnetic layer. The upper part of the second ferromagnetic layer may include i) a central interface in contact with the lower part of the second ferromagnetic layer and ii) an exposed surface surrounding the central interface.

The height of the pinned magnetic layer may be larger than the height of the free magnetic layer. The exposed surface may have a ring shape. The exposed surface may be formed by etching the pinned magnetic layer. The first ferromagnetic layer and the second ferromagnetic layer may include a compound having a chemical formula, $(A_{100-x}B_x)_{100-y}C_y$ ($0<x<100$, $0<y<100$), and "A" and "B" may be metal elements and "C" may be an element to obtain amorphous state.

The antiferromagnetic layer may include at least one compound selected from a group consisting of FeMn, IrMn, PtMn, CoO, and NiO. The "A" and the "B" may include at least one element selected from a group consisting of iron (Fe), cobalt (Co), nickel (Ni), manganese (Mn), and chrome (Cr), respectively. The "C" may include at least one element selected from a group consisting of boron (B), carbon (C), tantalum (Ta), rhenium (Re), hafnium (Hf), rhodium (Rh), chrome (Cr), copper (Cu), gadolinium (Gd), and terbium (Tb). The non-magnetic layer may include at least one layer selected from a group consisting of a non-magnetic metal layer, an insulating layer, and a semiconductor layer. When the non-magnetic layer may include the non-magnetic metal layer, the non-magnetic metal layer may include at least one element selected from a group consisting of copper (Cu), ruthenium (Ru), gold (Au), silver (Ag), tantalum (Ta), and aluminum (Al).

When the non-magnetic layer includes the insulating layer, the insulating layer may include a compound having a chemical formula, $D_{100-z}E_z$ (40<z<60), and "D" may include at least one element selected from a group consisting of lithium (Li), beryllium (Be), sodium (Na), magnesium (Ma), niobium (Nb), titanium (Ti), vanadium (V), tantalum (Ta), barium (Ba), palladium (Pd), zirconium (Zr), holmium (Ho), potassium (K), and silver (Ag), and "E" may include at least one element selected from a group consisting of oxygen (O), nitrogen (N), carbon (C), hydrogen (H), selenium (Se), chlorine (Cl), and fluorine (F). When the non-magnetic layer includes the semiconductor layer, the semiconductor layer may include at least one material selected from a group consisting of Si, GaAs, Ge, and SeZn.

The present invention may provide an oscillator having a high frequency oscillation characteristic even when an external magnetic field is not applied to the oscillator. Accordingly, in a case of configuring an electronic circuit for communication, a device for applying an external magnetic field is not necessary, so that the integration degree of the electronic circuit for communication is enhanced, device volume is reduced, and manufacturing costs of the electronic circuit for communication are decreased. Further, the stable operation of the oscillator may be achieved. In addition, the oscillation frequency may be changed by additionally applying an external magnetic field to the oscillator if necessary.

DETAILED DESCRIPTION OF THE EMBODIMENTS

It will be understood that when an element is referred to as being "on" another element, it can be directly on another element or intervening elements may be present therebetween. In contrast, when an element is referred to as being "directly on" another element, there are no intervening elements therebetween.

It will be understood that, although the terms first, second, third, etc. may be used herein to describe various elements, components, regions, layers, and/or sections, they are not limited thereto. These terms are only used to distinguish one element, component, region, layer, or section from another element, component, region, layer, or section. Thus, a first element, component, region, layer, or section discussed below could be termed a second element, component, region, layer, or section without departing from the range of the present invention.

Terminologies used herein are provided to merely mention specific exemplary embodiments and are not intended to limit the present invention. Singular expressions used herein include plurals unless they have definitely opposite meanings. The meaning of "including" used in this specification gives shape to specific characteristics, regions, positive numbers, steps, operations, elements, and/or components, and do not exclude the existence or addition of other specific characteristics, regions, positive numbers, steps, operations, elements, components, and/or groups.

Spatially relative terms, such as "below" and "above" and the like, may be used herein for ease of description to describe one element or feature's relationship to another element(s) or feature(s) as illustrated in the figures. It will be understood that spatially relative terms are intended to encompass different orientations of the device in use or operation in addition to the orientation depicted in the drawings. For example, if the device in the figures is turned over, elements described as "below" other elements or features would then be oriented "above" the other elements or features. Thus, the exemplary term "below" can encompass both an orientation of above and below. Apparatuses may be otherwise rotated 90° or at other angles, and the spatially relative descriptors used herein are then interpreted accordingly.

All the terminologies including technical terms and scientific terms used herein have the same meanings that those skilled in the art generally understand. Terms defined in dictionaries are construed to have meanings corresponding to related technical documents and the present description, and they are not construed as ideal or very official meanings, if not defined.

Exemplary embodiments of the present invention described with reference to cross-sectional views represent ideal exemplary embodiments of the present invention in detail. Therefore, various modification of diagrams, for example, modifications of manufacturing methods and/or specifications, are expected. Accordingly, exemplary embodiments are not limited to specific shapes of shown regions, and for example, also include modifications of the shape by manufacturing. For example, regions shown or described as flat may generally have rough or rough and nonlinear characteristics. Further, portions shown to have sharp angles may be rounded. Therefore, the regions shown in the drawings are basically just schematic and the shapes thereof are not intended to show the exact shapes of the region and are also not intended to reduce the scope of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
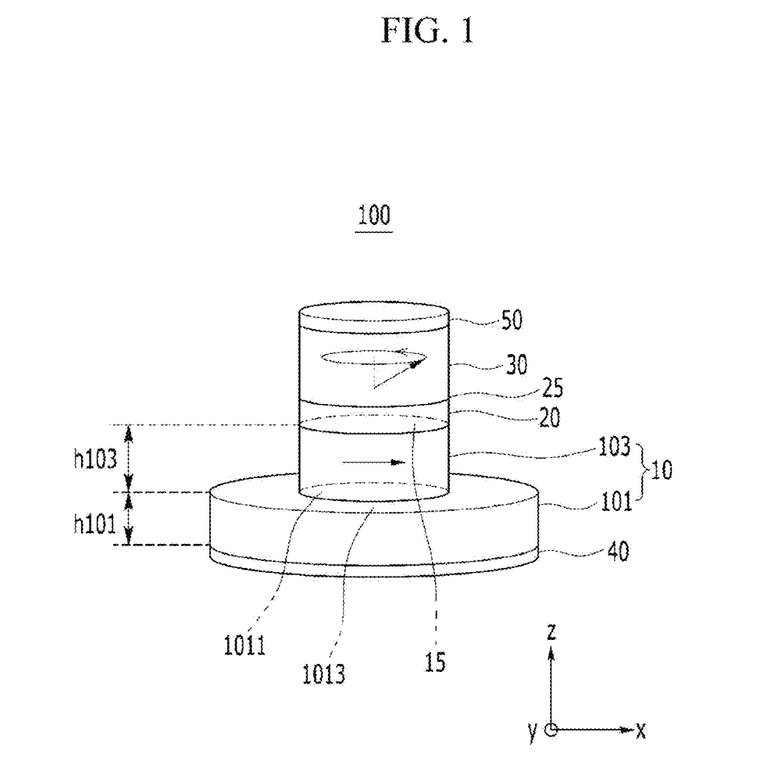
FIG. 1 is a perspective view schematically illustrating an oscillator according to a first exemplary embodiment of the present invention.

FIG. 1 is a perspective view schematically illustrating an oscillator 100 according to a first exemplary embodiment of the present invention. A structure of the oscillator 100 of FIG. 1 is an example of the present invention, and the present invention is not limited thereto. Accordingly, the structure of the oscillator 100 may be modified to various shapes.

As shown in FIG. 1, the oscillator 100 includes a pinned magnetic layer 10, a non-magnetic layer 20, and a free magnetic layer 30. In addition, the oscillator 100 may further include a buffer layer 40, a capping layer 50, and other layers if necessary.

The pinned magnetic layer 10 has a fixed magnetization. That is, as indicated by an arrow in FIG. 1, the pinned magnetic layer 10 may have a magnetization parallel to the positive x-axis direction, i.e. the interface 25. The pinned magnetic layer 10 is fabricated of a ferromagnetic material, so that the pinned magnetic layer 10 is magnetized in a specific direction. The pinned magnetic layer 10 includes a compound having a chemical formula, $(A_{100-x}B_x)_{100-y}C_y$ ($0<x<100$, $0<y<100$). Preferably, it may be $0<y\leq30$. When "y" is too small, it is impossible to fabricate the amorphous pinned magnetic layer, thereby failing to obtain a high magneto-resistance ratio. Further, when "y" is too large, it is impossible to sufficiently obtain a spin polarization ratio. Here, "A" and "B" may be metal elements, and "C" may be an element to obtain an amorphous state. For example, "A" and "B" may include iron (Fe), cobalt (Co), nickel (Ni), manganese (Mn), or chrome (Cr), or a compound thereof. Further, the amorphous element, "C", may include boron (B), carbon (C), tantalum (Ta), rhenium (Re), hafnium (Hf), rhodium (Rh), chrome (Cr), copper (Cu), gadolinium (Gd), or terbium (Tb), or a compound thereof. The pinned magnetic layer 10 having a ferromagnetic property may be fabricated using the aforementioned elements.

The non-magnetic layer 20 is located between the pinned magnetic layer 10 and the free magnetic layer 30. The non-magnetic layer 20 forms the interface 25 with the free magnetic layer 30 and comes in contact with the pinned magnetic layer 10. The non-magnetic layer 20 may made of a non-magnetic metal layer, an insulating layer, or a semiconductor layer. That is, the non-magnetic layer 20 may be fabricated of a material, such as a non-magnetic metal, an insulator material, or a semiconductor material. The non-magnetic metal may include copper (Cu), ruthenium (Ru), gold (Au), silver (Ag), tantalum (Ta), or aluminum (Al), or a compound thereof. When the non-magnetic layer 20 includes an insulating layer, the insulating layer may include a compound having a chemical formula, $D_{100-z}E_z$ ($0<z<100$). Preferably, it may be $40\leq z\leq60$. When "z" is too small or too large, it is impossible to obtain a chemically stable material. Here, "ID" may include lithium (Li), beryllium (Be), sodium (Na), magnesium (Ma), niobium (Nb), titanium (Ti), vanadium (V), tantalum (Ta), barium (Ba), palladium (Pd), zirconium (Zr), holmium (Ho), potassium (K), or silver (Ag), or a compound thereof. Further, "E" may include oxygen (O), nitrogen (N), carbon (C), hydrogen (H), selenium (Se), chlorine (Cl), or fluorine (F), or a compound thereof. Further, when the non-magnetic layer 20 is a semiconductor layer, the semiconductor layer may include Si, GaAs, Ge, or SeZn, or a compound thereof.

As shown in FIG. 1, the free magnetic layer 30 has a magnetization which is switchable and rotates with respect to the direction of the pinned layer. When a current is applied to the oscillator 100, the magnetization of the free magnetic layer 30 may be rotated by the STT of the applied current. The free magnetic layer 30 includes a compound having a chemical formula of $(A_{100-x}B_x)_{100-y}C_y$ ($0<x<100$, $0<y<100$). Preferably, it may be $0<y\leq30$. When "y" is too small, it is impossible to fabricate the amorphous pinned magnetic layer, thereby failing to obtain a high magneto-resistance ratio. Further, when "y" is too large, it is impossible to sufficiently obtain the spin polarization ratio.

Here, "A" and "B" may be metal elements, and "C" may be an amorphous element. For example, "A" and "B" may include iron (Fe), cobalt (Co), nickel (Ni), manganese (Mn), or chrome (Cr), or a compound thereof. Further, the amorphous element, "C", may include boron (B), carbon (C), tantalum (Ta), rhenium (Re), hafnium (Hf), rhodium (Rh), chrome (Cr), copper (Cu), gadolinium (Gd), or terbium (Tb), or a compound thereof. The free magnetic layer 30 may be fabricated using the aforementioned elements.

As shown in FIG. 1, the buffer layer 40 is located under the pinned magnetic layer 10. The buffer layer 40 may be fabricated of a conductive metal. The capping layer 50 is located on the free magnetic layer 30 and may be fabricated of a conductive metal. Accordingly, the current may be applied to the oscillator 100 by using the buffer layer 40 and the capping layer 50.

The pinned magnetic layer 10 includes a first part of the fixed magnetic layer 101 and a second part of the fixed magnetic layer 103. The second part of the fixed magnetic layer 103 is located on the first part of the fixed magnetic layer 101 and comes in contact with the non-magnetic layer 20. As shown in FIG. 1, the lateral dimension of the first part of the fixed magnetic layer 101 is larger than that of the second part of the fixed magnetic layer 103. The first part of the fixed magnetic layer 101 includes an interface 1011 and a surface 1013. The first interface 1011 is formed to contact with the first part of the fixed magnetic layer 101 and the second part of the fixed magnetic layer 103, and the second surface 1013 is formed to surround the first interface 1011. The second surface 1013 is formed to be exposed outside and has a ring shape. The second surface 1013 may have an elliptical ring shape or a round ring shape, and may have a shape of a predetermined looped curved line having the same topology.

A cross-section area of the second part of the fixed magnetic layer 103 cut along a direction of an xy plane which is parallel to the interface 25, is almost the same as the area of the interface 15 in which the second part of the fixed magnetic layer 103 comes in contact with the non-magnetic layer 20. That is, since the second part of the fixed magnetic layer 103 and the non-magnetic layer 20 are disposed in parallel such that the surface of the second part of the fixed magnetic layer 103 corresponds to a surface of the non-magnetic layer 20 in a z-axis direction, stray magnetic field may be more easily formed by the second part of the fixed magnetic layer 103.

The second surface 1013 may be formed by partially etching the pinned magnetic layer 10. As a result, the stray magnetic field is formed on the second surface 1013 along a side surface of the second part of the fixed magnetic layer 103, so that the stray magnetic field from the fixed magnetic layer is applied to the free magnetic layer 30. As a result, when the magnitude and direction of the stray magnetic field conform to a condition of the generation of the spin oscillation, the magnetization of the free magnetic layer 30 may be rotated by the STT of the applied current even if the magnetic field is not applied to the oscillator from the outside. That is, the stray magnetic field induced by the pinned magnetic layer 10 is magnetically combined with the free magnetic layer 30, resulting in the generation of a magnetic dipole interaction, so that the magnetization direction of the free magnetic layer 30 may be rotated only with the STT of the spin-polarized conduction electrons. Accordingly, even if the magnetic field is not applied to the oscillator 100 from the outside, the oscillator 100 may generate the high frequency AC oscillation signal. Further, when a current larger than a threshold value and an external magnetic field are simultaneously applied to the oscillator 100, the oscillator 100 may generate the high frequency AC signal while the magnetization of the free magnetic layer 30 rotates with a frequency of several GHz to several tens of GHz.

By contrast, when the pinned magnetic layer included in the oscillator is not partially etched, the stray magnetic field is not sufficiently generated. If the whole pinned magnetic layer is not etched, and only the free magnetic layer and the non-magnetic layer are completely etched, the magnetic interaction between the pinned magnetic layer and the free magnetic layer is minimized. In this case, the magnetization of the pinned magnetic layer becomes stable. It is also possible to obtain a high-quality oscillation output in this type of oscillator. However, the oscillator may generate the high frequency oscillation signal only when an external magnetic field is applied to the oscillator. Accordingly, when an electronic circuit for communication including the oscillator is constructed, the oscillator is required to additionally include a device and method for applying an external magnetic field to the oscillator, thereby generating a problem that a degree of integration of the electronic becomes low, and the device volume is increased, and fabricating costs thereof increase. By contrast, the oscillator 100 of FIG. 1 is designed such that the stray magnetic field is generated and thus may generate the oscillation signal even if an external magnetic field is not applied to the oscillator 100.

As shown in FIG. 1, the height h103 of the second part of the fixed magnetic layer 103 is larger than the height h101 of the first part of the fixed magnetic layer 101. That is, the intensity of the stray magnetic field generated in the oscillator 100 may be increased by elongating a side surface of the second part of the fixed magnetic layer 103. As a result, even if an external magnetic field is not applied to the oscillator 100, the oscillator 100 may generate the high frequency signals.

Figure 2:
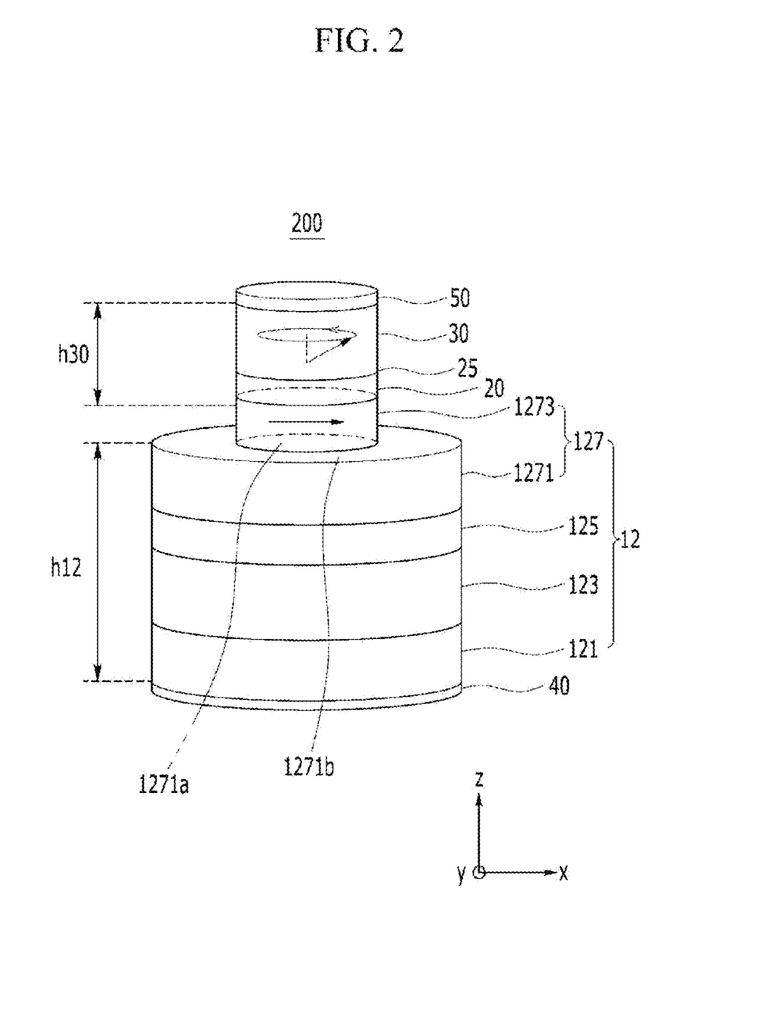
FIG. 2 is a perspective view schematically illustrating an oscillator according to a second exemplary embodiment of the present invention.

FIG. 2 is a perspective view schematically illustrating an oscillator 200 according to a second exemplary embodiment of the present invention. A structure of the oscillator 200 of FIG. 2 is similar to that of the oscillator 100 of FIG. 1, and therefore like reference numerals designate like elements and detailed descriptions thereof will be omitted.

As shown in FIG. 2, the oscillator 200 includes a pinned magnetic layer 12, a non-magnetic layer 20, a free magnetic layer 30, a buffer layer 40, and a capping layer 50. Here, the pinned magnetic layer 30 includes an antiferromagnetic layer 121, a first ferromagnetic layer 123, a non-magnetic metal layer 125, and a second ferromagnetic layer 127. The first ferromagnetic layer 123 is located on the antiferromagnetic layer 121, and the non-magnetic metal layer 125 is located on the first ferromagnetic layer 123. The second ferromagnetic layer 127 is located on the non-magnetic metal layer 125 and comes in contact with the non-magnetic layer 20.

Here, a magnetization of the first ferromagnetic layer 123 and a magnetization of the second ferromagnetic layer 127 may be anti-parallel. For example, when the magnetization of the first ferromagnetic layer 123 is the positive x-axis direction, the magnetization of the second ferromagnetic layer 127 may be in the minus x-axis direction. The first ferromagnetic layer 123 and the second ferromagnetic layer 127 maintain the magnetization parallel to a direction interface plane 25, i.e. an xy plane. The first ferromagnetic layer 123 and the second ferromagnetic layer 127 include a compound having a chemical formula of $(A_{100-x}B_x)_{100-y}C_y$, ($0<x<100$, $0<y<100$). Preferably, it may be $0<y\leq30$. When "y" is too small, it is impossible to fabricate the amorphous pinned magnetic layer, thereby failing to obtain a high magneto-resistance ratio. Further, when "y" is too large, it is impossible to sufficiently obtain a spin polarization ratio. Here, "A" and "B" may be metal elements, and "C" may be an amorphous element. For example, "A" and "B" may include iron (Fe), cobalt (Co), nickel (Ni), manganese (Mn), or chrome (Cr), or a compound thereof. Further, the amorphous element, "C", may include boron (B), carbon (C), tantalum (Ta), rhenium (Re), hafnium (Hf), rhodium (Rh), chrome (Cr), copper (Cu), gadolinium (Gd), or terbium (Tb), or a compound thereof. The fixed ferromagnetic layer 123 and the second ferromagnetic layer 127 having a ferromagnetic property may be fabricated using the aforementioned elements.

The antiferromagnetic layer 121 may be fabricated of a material, such as a mixture including FeMn, IrMn, or a PtMn, or an oxide including CoO or NiO. Further, the non-magnetic metal layer 125 may be fabricated by selecting a material which is usable as a material of the non-magnetic layer 20.

The height h12 of the pinned magnetic layer 12 may be larger than the height h30 of the free magnetic layer 30. Since the height h12 of the pinned magnetic layer 12 is larger than the height h30 of the free magnetic layer 30, the pinned magnetic layer 12 may have a large magnetic moment. Accordingly, the magnetization direction may be maintained without being disturbed due to the STT.

As shown in FIG. 2, the second ferromagnetic layer 127 includes a lower part of the second ferromagnetic layer 1271 and a upper part of second ferromagnetic layer 1273. The upper part of the second ferromagnetic layer 1273 is located on the lower part of the first ferromagnetic layer 1271 and comes in contact with the non-magnetic layer 20. The lower part of the second ferromagnetic layer 1271 includes a central interface 1271a and an exposed surface 1271b. The central interface 1271a is formed by the contact between the lower part of the second ferromagnetic layer 1271 and the upper part of the second ferromagnetic layer 1273, and the exposed surface 1271b is formed to surround the central interface 1271a. Since the oscillator 200 has the aforementioned construction, a stray magnetic field is formed in a side surface of the upper part of the second ferromagnetic layer 1273, thereby having magnetic dipole interaction with the free magnetic layer 30.

The oscillator 200 is influenced by the stray magnetic field as if an external magnetic field is applied to the oscillator 200 in one direction. Accordingly, the magnetization direction of the free magnetic layer 30 may be rotated only with the STT of the spin-polarized conduction electrons, even without the application of an external magnetic field. Further, a tunnel magneto-resistance is used to read the magnetization, so that the oscillator 200 generates an AC oscillation signal of high frequency. The frequency of the oscillator 200 may be controlled by changing the size of a current flowing through an oscillating device (not shown) including the oscillator 200.

Hereinafter, the present invention will be described through experimental examples in more detail. However, the experimental examples are only illustrative for the present invention and the present invention is not limited thereto Experimental Example A lower buffer layer for applying a current was fabricated by sequentially depositing Ta of 5 nm thickness, CuN of 30 nm thickness, and Ta of 5 nm thickness on a silicon substrate. Then, an antiferromagnetic layer, $Pt_{37}Mn_{63}$ of 20 nm thickness, was deposited, followed by sequentially depositing a first ferromagnetic layer, $Co_7Fe_3$ of 3 nm thickness, a non-magnetic metal layer, Ru of 0.8 nm thickness, and a second ferromagnetic layer, $Co_6Fe_2B_2$ of 5 nm thickness, on the antiferromagnetic layer, to form an SAF (synthetic antiferromagnetic) lamination structure. A non-magnetic layer, MgO of 1 nm thickness, that was an insulator, was deposited on the second ferromagnetic layer, and a free magnetic layer, a single layer made of $Co_6Fe_2B_2$ of 2 nm thickness, was deposited on the non-magnetic layer. Next, Ta of 10 nm thickness, CuN of 10 nm thickness, and Ru of 7 nm thickness were sequentially deposited on the free magnetic layer to form a capping layer. From the capping layer to a part of the second ferromagnetic layer were controlled to be etched by ion milling a magnetic tunnel junction fabricated through the aforementioned process, so that a side surface of the second ferromagnetic layer formed on the non-magnetic layer was partially exposed. As a result, the oscillator having an elliptical-shaped magnetic tunnel junction of a size of $100 \times 60 \text{ nm}^2$ was manufactured.

Comparative Example

A magnetic tunnel junction was fabricated with the same method as that of the aforementioned experimental example. The magnetic tunnel junction was etched only up to the non-magnetic layer by ion milling. The fabricated magnetic tunnel junction for a shorter time than that of the aforementioned experimental example, and the second ferromagnetic layer was not etched.

As a result, the oscillator having an elliptical-shaped magnetic tunnel junction of a size of 100×60 nm$^2$ was manufactured.

Experiment Result

Example of Magnetic Hysteresis Curve

Figure 3:
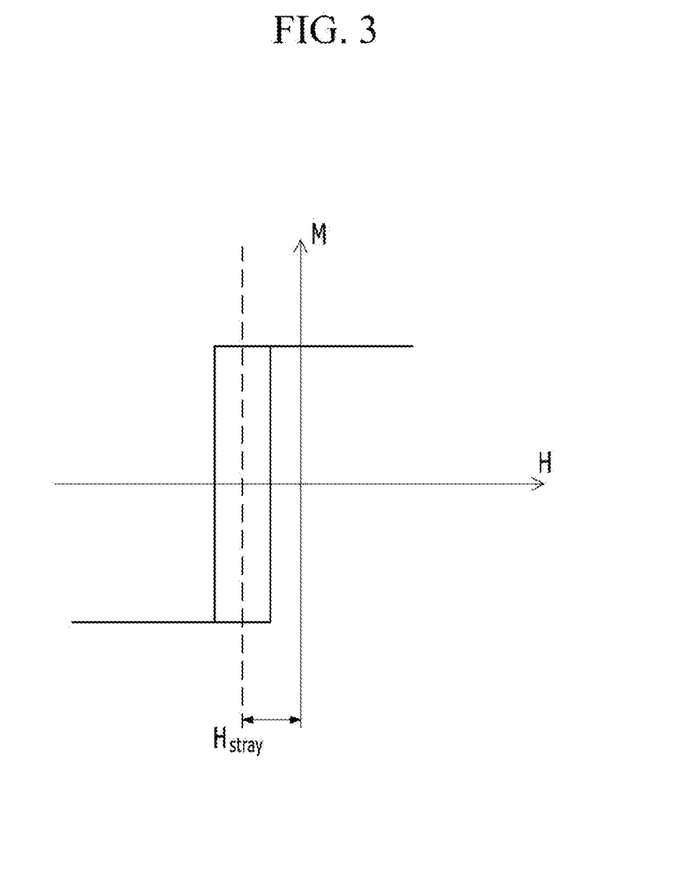
FIGS. 3 and 4 are magnetic hysteresis curves of an oscillator according to the experimental example and the comparative example, respectively.
Figure 4:
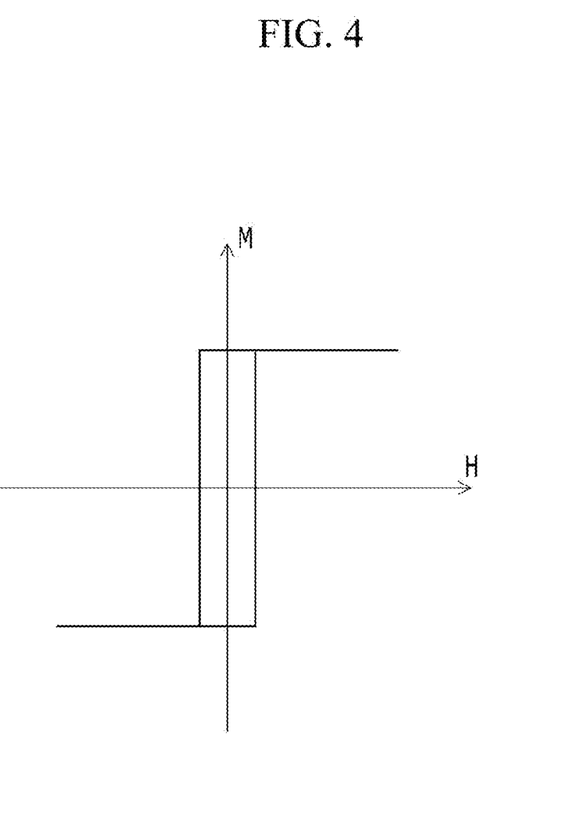

FIG. 3 is a magnetic hysteresis curve of the oscillator which may be manufactured according to the experimental example, and FIG. 4 is a magnetic hysteresis curve of the oscillator which may be manufactured according to the comparative example.

As show in FIG. 3, the magnetic hysteresis curve formed by the free magnetic layer has been significantly shifted from the origin point. This results from the stray magnetic field ($H_{stray}$) formed by the pinned magnetic layer which is partially etched and exposed. The magnitude of the stray magnetic field may be controlled by adjusting the thickness, the height of the exposed part, and a shape of the pinned magnetic layer.

By contrast, as shown in FIG. 4, the magnetic hysteresis curve of the oscillator manufactured according to the comparative example is symmetric with respect to the applied magnetic field (H) and does not show the shift of the curve from the origin. That is, the stray magnetic field is not substantially high in the oscillator manufactured according to the comparative example, so that there is no large shift of the magnetic hysteresis curve.

Experiment of Tunnel Magneto-resistance Characterization

The tunnel magneto-resistance of the oscillator manufactured according to the experimental example of the present invention was characterized. That is, the tunnel magneto-resistance of the oscillator in a state where an external magnetic field was not applied to the oscillator was measured.

Figure 5:
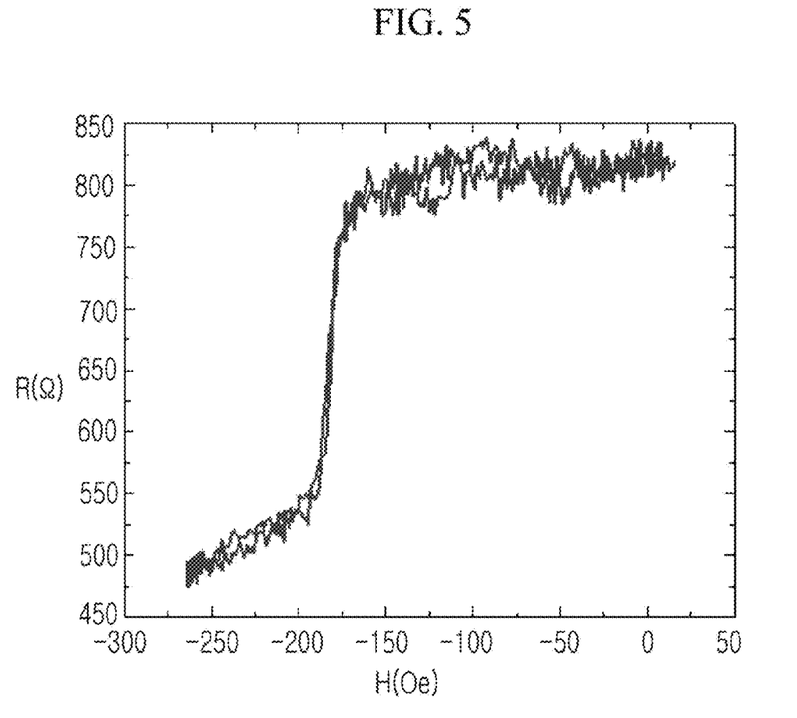
FIG. 5 is a graph illustrating a characteristic of a tunnel magneto-resistance of an oscillator according to the experimental example.

FIG. 5 is a graph illustrating a tunnel magneto-resistance of the oscillator manufactured according to the experimental example of the present invention.

As shown in FIG. 5, it can be seen that the entire graph moves approximately 181.5 Oe in a negative direction. This results from the formation of the stray magnetic field ($H_{stray}$) by the pinned magnetic layer. That is, the stray magnetic field was formed from the exposed side surface of the second ferromagnetic layer made of $Co_6Fe_2B_2$, so that the stray magnetic field formed the magnetic dipole coupling with the free magnetic layer. As a result, even if an external magnetic field was not applied to the oscillator, the pinned magnetic layer and the free magnetic layer maintained an anti-parallel relation each other.

Oscillation Characteristic Experiment 1

The oscillator manufactured according to the experimental example of the present invention was investigated. That is, the oscillation characteristic of the oscillator when a weak external magnetic field of about 50 Oe was applied to the oscillator was observed.

Figure 6:
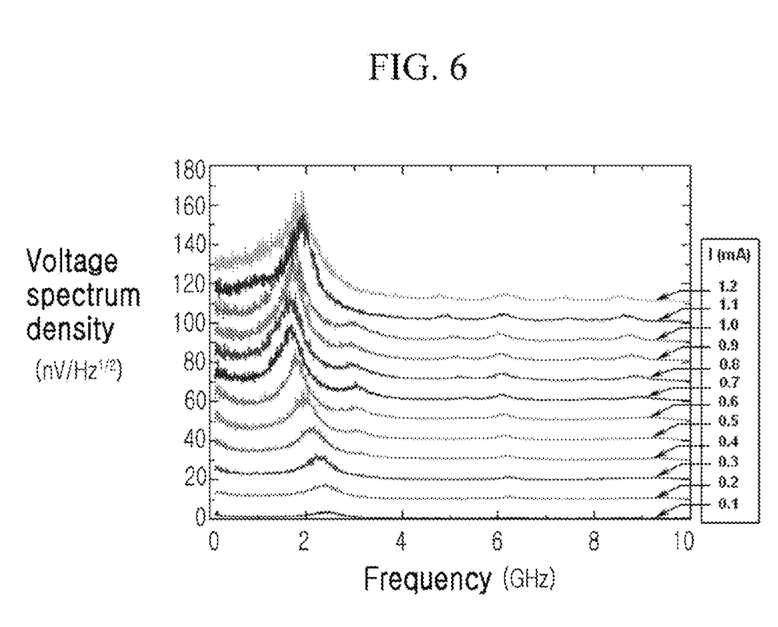
FIG. 6 and FIG. 7 are graphs illustrating an oscillation characteristic of an oscillator according to the Experimental Examples, respectively.

FIG. 6 is a graph illustrating the oscillation characteristic when a weak external magnetic field of about 50 Oe was applied to the oscillator manufactured according to the experimental example of the present invention.

As shown in FIG. 6, an oscillation frequency was controllable by changing a size of a current flowing through the magnetic tunnel junction from 0.1 mA to 1.2 mA. Accordingly, the oscillation frequency generated from the oscillator was controllable by changing a quantity of the current applied to the oscillator.

Oscillation Characteristic Experiment 2

An experiment of characterizing the oscillator manufactured according to the experimental example of the present invention was conducted. That is, the characteristic of the oscillator when a magnetic field of 200 Oe to 0 Oe was applied to the oscillator was observed.

Figure 7:
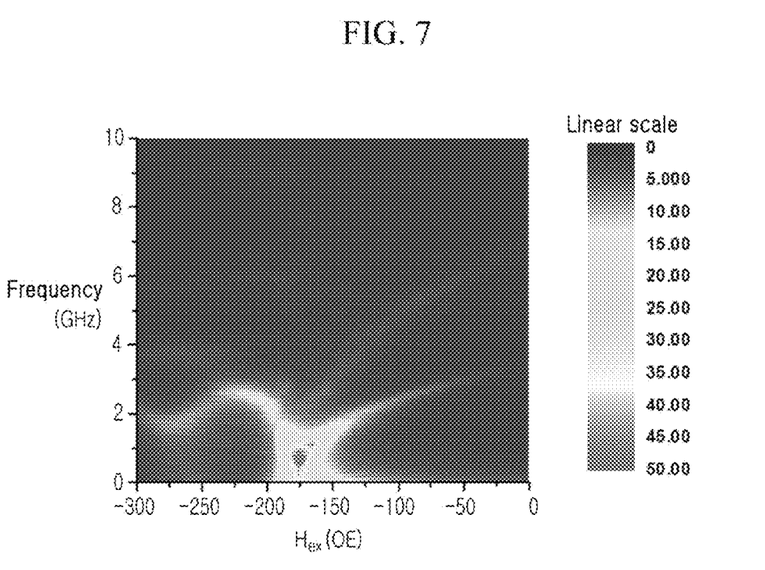

FIG. 7 is a graph illustrating the oscillation characteristic when a magnetic field of 200 Oe to 0 Oe was applied to the oscillator manufactured according to the experimental example of the present invention.

When the applied external magnetic field was changed from 200 Oe to 0 Oe, an output frequency band was changed from several hundreds of MHz to approximately 3 GHz. Accordingly, as described above, the oscillator represented a weak oscillation characteristic even when the external magnetic field was not applied, and the oscillator provided a high-power oscillation when the external magnetic field was applied. Accordingly, it could be identified that the oscillator manufactured according to the experimental example of the present invention produced the high frequency oscillation.

While this invention has been described in connection with what is previously described, it will be readily understood by those skilled in the art that various modifications and changes can be made thereto within the technical spirit and range of the claims of the present invention.

What is claimed is:

1. An oscillator comprising:
a pinned magnetic layer having a fixed magnetization direction;
a non-magnetic layer located on the pinned magnetic layer; and
a free magnetic layer located on the non-magnetic layer and having a switchable magnetization and rotating with respect to the direction of pinned magnetic layer,
wherein the pinned magnetic layer has a magnetization parallel to an interface between the free magnetic layer and the non-magnetic layer, and
the pinned magnetic layer comprises:
an antiferromagnetic layer;
a first ferromagnetic layer located on the antiferromagnetic layer;
a non-magnetic metal layer located on the first ferromagnetic layer; and
a second ferromagnetic layer located on the non-magnetic metal layer and that comes in contact with the non-magnetic layer, and wherein
the second ferromagnetic layer comprises:
a lower part;
a upper part located on the lower part in which the upper part comes in contact with the non-magnetic layer; and
a central interface between the upper part and the lower part in which the lower part having an exposed surface exposed to an outside while surrounding the central interface.

2. The oscillator of claim 1, wherein the exposed surface of the lower part has a ring shape.

3. The oscillator of claim 1, wherein the pinned magnetic layer and the free magnetic layer include a compound having a chemical formula, $(A_{100-x}B_x)_{100-y}C_y$ (0<x<100, 0<y<100), and the "A" and the "B" are metal elements and the "C" is an element to obtain amorphous state.

4. The oscillator of claim 3, wherein the "A" and the "B" include at least one element selected from a group consisting of iron (Fe), cobalt (Co), nickel (Ni), manganese (Mn), and chrome (Cr), respectively.

5. The oscillator of claim 3, wherein the "C" includes at least one element selected from a group consisting of boron (B), carbon (C), tantalum (Ta), rhenium (Re), hafnium (Hf), rhodium (Rh), chrome (Cr), copper (Cu), gadolinium (Gd), and terbium (Tb).

6. The oscillator of claim 1, wherein the non-magnetic layer comprises at least one layer selected from a group consisting of a non-magnetic metal layer, an insulating layer, and a semiconductor layer.

7. The oscillator of claim 6, wherein
when the non-magnetic layer comprises the non-magnetic metal layer, the non-magnetic metal layer includes at least one element selected from a group consisting of copper (Cu), ruthenium (Ru), gold (Au), silver (Ag), tantalum (Ta), and aluminum (Al);
when the non-magnetic layer comprises the insulating layer, the insulating layer includes a compound having a chemical formula, $D_{100-z}E_z$ ($40<z<60$), and the "D" includes at least one element selected from a group consisting of lithium (Li), beryllium (Be), sodium (Na), magnesium (Ma), niobium (Nb), titanium (Ti), vanadium (V), tantalum (Ta), barium (Ba), palladium (Pd), zirconium (Zr), holmium (Ho), potassium (K), and silver (Ag), and the "E" includes at least one element selected from a group consisting of oxygen (O), nitrogen (N), carbon (C), hydrogen (H), selenium (Se), chlorine (Cl), and fluorine (F); and
when the non-magnetic layer comprises the semiconductor layer, the semiconductor layer includes at least one material selected from a group consisting of Si, GaAs, Ge, and SeZn.

8. The oscillator of claim 1, wherein a cross-section area of the upper part cut along a direction parallel to the central interface is almost equal to an area of the central interface.

9. The oscillator of claim 1, wherein the exposed surface is formed by etching the pinned magnetic layer.

10. An oscillator comprising:
a pinned magnetic layer having a fixed magnetization;
a non-magnetic layer located on the pinned magnetic layer; and
a free magnetic layer located on the non-magnetic layer and having a switchable magnetization and rotating with respect to the direction of the fixed magnetization of the pinned magnetic layer,
wherein the pinned magnetic layer has a magnetization parallel to an interface between the free magnetic layer and the non-magnetic layer, and
the pinned magnetic layer comprises:
an antiferromagnetic layer,
a first ferromagnetic layer located on the antiferromagnetic layer,
a non-magnetic metal layer located on the first ferromagnetic layer, and
a second ferromagnetic layer located on the non-magnetic metal layer and that comes in contact with the non-magnetic layer, and wherein the second ferromagnetic layer comprises:
a lower part of the second ferromagnetic layer and
a upper part of the second ferromagnetic layer located on the lower part of the second ferromagnetic layer and that comes in contact with the non-magnetic layer, and the upper part of the second ferromagnetic layer comprises:
a central interface in contact with the lower part of the second ferromagnetic layer and
an exposed surface exposed to an outside while surrounding the central interface.

11. The oscillator of claim 10, wherein the height of the pinned magnetic layer is larger than the height of the free magnetic layer.

12. The oscillator of claim 10, wherein the exposed surface has a ring shape.

13. The oscillator of claim 10, wherein the exposed surface is formed by etching the pinned magnetic layer.

14. The oscillator of claim 10, wherein the first ferromagnetic layer and the second ferromagnetic layer include a compound having a chemical formula, $(A_{100-x}B_x)_{100-y}C_y$ ($0<X<100$, $0<y<100$), and the "A" and the "B" are metal elements and the "C" is an element to obtain amorphous state.

15. The oscillator of claim 14, wherein the "A" and the "B" include at least one element selected from a group consisting of iron (Fe), cobalt (Co), nickel (Ni), manganese (Mn), and chrome (Cr), respectively.

16. The oscillator of claim 14, wherein the "C" includes at least one element selected from a group consisting of boron (B), carbon (C), tantalum (Ta), rhenium (Re), hafnium (Hf), rhodium (Rh), chrome (Cr), copper (Cu), gadolinium (Gd), and terbium (Tb).

17. The oscillator of claim 10, wherein the antiferromagnetic layer includes at least one compound selected from a group consisting of FeMn, IrMn, PtMn, CoO, and NiO.

18. An oscillator comprising:
a pinned magnetic layer comprising:
an antiferromagnetic layer,
a first ferromagnetic layer on the antiferromagnetic layer,
a non-magnetic metal layer on the first ferromagnetic layer, and
a second ferromagnetic layer on the non-magnetic metal layer wherein the second ferromagnetic layer comprises:
a lower part;
an upper part on the lower part; and
a central interface between the lower part and the upper part,
wherein the lower part comprises an exposed surface exposed
to an outside while surrounding the central interface;
a non-magnetic layer on the upper part; and
a free magnetic layer on the non-magnetic layer in which the free magnetic layer comprising a switchable magnetization direction parallel to a magnetic direction of the upper part.

19. The oscillator of claim 18, wherein the antiferromagnetic layer comprises a compound selected from a group consisting of FeMn, IrMn, PtMn, CoO, and NiO.

20. The oscillator of claim 18, wherein the non-magnetic layer is selected from the group consisting of a non-magnetic metal layer, an insulating layer, and a semiconductor layer, wherein
when the non-magnetic layer comprises the non-magnetic metal layer, the non-magnetic metal layer comprises at least one element selected from a group consisting of copper (Cu), ruthenium (Ru), gold (Au), silver (Ag), tantalum (Ta), and aluminum (Al);
when the non-magnetic layer comprises the insulating layer, the insulating layer comprises a compound having a chemical formula, $D_{100-z}E_z$ ($40<z<60$), in which the "D" comprises at least one element selected from a group consisting of lithium (Li), beryllium (Be), sodium (Na), magnesium (Ma), niobium (Nb), titanium (Ti), vanadium (V), tantalum (Ta), barium (Ba), palladium (Pd), zirconium (Zr), holmium (Ho), potassium (K), and silver (Ag), and the "E" includes at least one element selected from a group consisting of oxygen (O), nitrogen (N), carbon (C), hydrogen (H), selenium (Se), chlorine (Cl), and fluorine (F); and when the non-magnetic layer comprises the semiconductor layer, the semiconductor layer is selected from a group consisting of Si, GaAs, Ge, and SeZn.

* * * * *